(12) United States Patent
Deng

(10) Patent No.: US 6,975,143 B2
(45) Date of Patent: Dec. 13, 2005

(54) STATIC LOGIC DESIGN FOR CMOS

(75) Inventor: Xiaowei Deng, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 846 days.

(21) Appl. No.: 09/932,395

(22) Filed: Aug. 16, 2001

(65) Prior Publication Data

US 2002/0021146 A1 Feb. 21, 2002

Related U.S. Application Data

(60) Provisional application No. 60/226,178, filed on Aug. 18, 2000.

(51) Int. Cl.$^7$ .............................................. H03K 19/20
(52) U.S. Cl. ........................ 326/121; 326/83; 326/119
(58) Field of Search ............................. 326/82–90, 112, 326/119, 121, 199

(56) References Cited

U.S. PATENT DOCUMENTS

| | | | | |
|---|---|---|---|---|
| 4,991,140 A | * | 2/1991 | Wang et al. | 365/203 |
| 5,124,585 A | * | 6/1992 | Kim et al. | 326/87 |
| 5,128,563 A | * | 7/1992 | Hush et al. | 326/87 |
| 5,726,589 A | * | 3/1998 | Cahill et al. | 326/81 |
| 5,939,900 A | * | 8/1999 | Wu | 326/121 |
| 5,986,476 A | * | 11/1999 | De | 326/98 |
| 6,016,064 A | * | 1/2000 | Saeki | 326/121 |
| 6,268,750 B1 | * | 7/2001 | Esch, Jr. | 327/170 |

* cited by examiner

Primary Examiner—Don Le
(74) Attorney, Agent, or Firm—Peter K. McLarty; W. James Brady, III; Frederick J. Telecky, Jr.

(57) ABSTRACT

A static logic circuit with a pull-up network (155) and a pull-down network (160). The network is fabricated on SOI substrates and the pull-up network comprises at least one NMOS transistor (115) and the pull down network comprises at least one PMOS transistor (120).

15 Claims, 3 Drawing Sheets

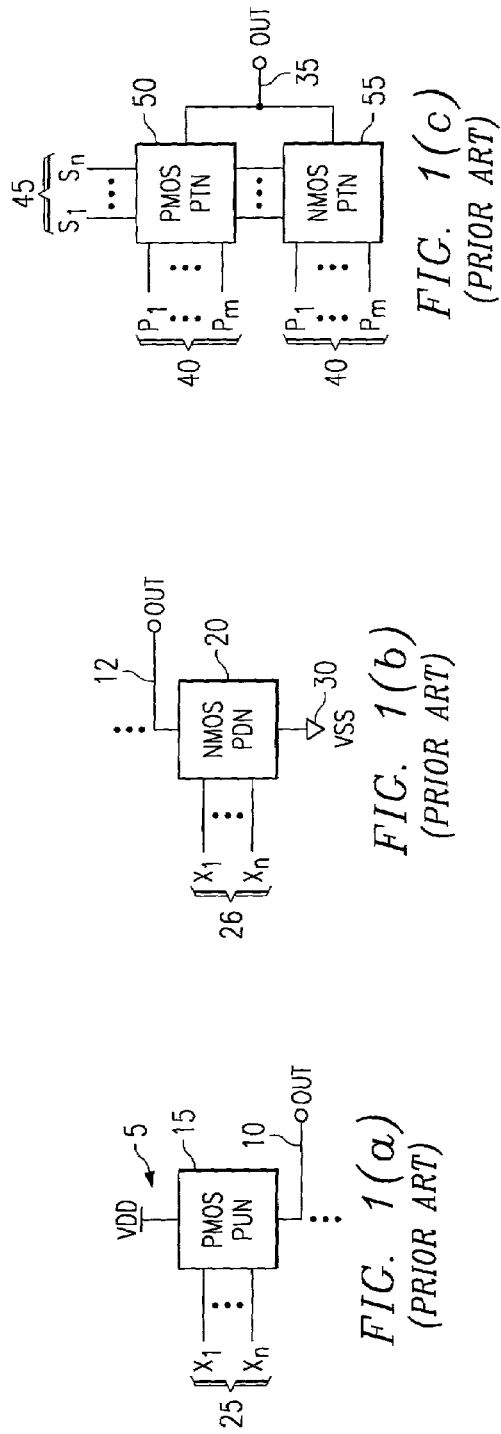
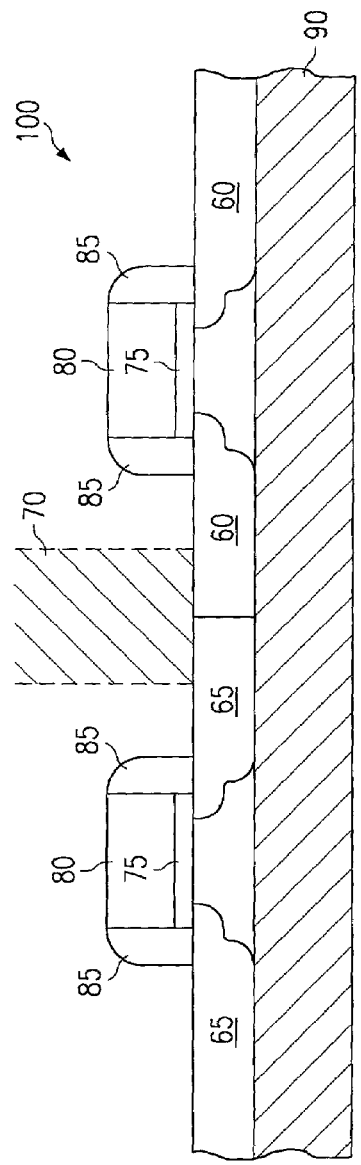

STATIC LOGIC DESIGN FOR CMOS

This application claims priority under 35 U.S.C. § 119(e)(1) of provisional application Ser. No. 60/226,178, filed Aug. 18, 2000.

FIELD OF THE INVENTION

The invention is generally related to the field of logic circuits and more specifically to a novel design methodology for achieving faster circuits with a more compact circuit layout.

BACKGROUND OF THE INVENTION

Designing small, fast, low-power, and reliable logic circuits is becoming more difficult with scaling. Integrated logic circuits on silicon on insulator (SOI) substrates are beginning to find increasing usage in an effort to achieve these goals. SOI refers to a silicon substrate where the top layer (in which the devices are fabricated) is separated from the "bulk" portion of the substrate by a insulator layer. This can be contrasted with bulk silicon substrates which have no buried insulator layer. In bulk CMOS circuits, NMOS transistors are fabricated in p-type wells and PMOS devices are formed in n-type wells with both well structures formed in the substrate. These well structures provide the electrical isolation required between the NMOS and PMOS transistors in CMOS logic circuits. The spacing requirement of these well structures for proper electrical isolation in bulk CMOS logic circuit fabrication has led to grouping of NMOS and PMOS transistors to maximize circuit density. In bulk CMOS circuits, basic transistor networks performing logic functions can be classified as the following three types: pull-up network (PUN), which conditionally forms a current path between the output node and the circuit power supply, pull-down network (PDN), which conditionally forms a current path between the output node and the circuit ground, and pass-transistor network (PTN), which conditionally forms a current path between the output node and the pass inputs. In general only PMOS transistors are used in a PUN, as shown in FIG. 1(a), only NMOS transistors are used in a PDN, as shown in FIG. 1(b), and only PMOS or only NMOS transistors are used in a PTN, as shown in FIG. 1(c). In FIG. 1(a) the PUN 15 comprises a circuit of PMOS transistors. The input terminals 25 represent the logic input terminals. Given certain input logic signals, the PUN will force the output 10 to approach the supply voltage $V_{DD}$ 5. In FIG. 1(b), the PDN 20 comprises a circuit of NMOS transistors. For certain input logic signals applied to the PDN input terminals 26, the PDN will force the voltage on the output terminal 12 to approach the voltage $V_{SS}$ 30. In most cases the voltage $V_{SS}$ is the circuit ground voltage of zero volts. In FIG. 1(c) the first PTN 50 comprises PMOS transistors and the second PTN 55 comprises NMOS transistors. For certain control signals applied to the control inputs 45, either the first PTN 50, the second PTN 55, or both will pass the signal on the input terminals 40 through to the output terminal 35. In early NMOS logic circuits, both enhancement and depletion mode NMOS transistors were used as pull up devices. In these NMOS circuits however, the gate of the enhancement transistor was connected to a fixed voltage (usually the supply voltage) and the gate of the depletion transistor was connected to the output node.

Conventional SOI logic circuits are based on bulk CMOS logic with conventional SOI circuits and bulk CMOS circuits sharing the same circuit topology. Thus in conventional SOI logic circuits, only PMOS transistors are used in a PUN, only NMOS transistors are used in a PDN, and only PMOS or only NMOS transistors are used in a PTN. This circuit layout and design methodology while optimized for bulk CMOS circuits does not take full advantage of the unique properties of SOI substrates. A new circuit design methodology is therefore required that fully utilizes the properties of SOI substrates for CMOS logic circuits.

SUMMARY OF THE INVENTION

The static logic circuit described here maximizes the advantages obtained from using SOI substrates. The instant invention comprises static logic circuits with pull-down networks comprised of PMOS transistors and pull-up networks comprising NMOS transistors. In particular the instant invention is a static logic circuit on a SOI substrate, comprising: a pull-up network comprising a plurality of parallel connected MOS transistors with a first and second common node, wherein at least one of said plurality of parallel connected MOS transistors is a NMOS transistor and at least one of said plurality of parallel connected MOS transistors is a PMOS transistor; a circuit supply voltage which is connected to said first common node of said pull-up network; a pull-down network which is connected to said second common node of said pull-up network; and an output node which is connected to said second common node of said pull-up network. In addition, the pull-down network comprises a plurality of series connected MOS transistors connected to a circuit ground; at least one of said plurality of series connected MOS transistors is a NMOS transistor and at least one of said plurality of series connected MOS transistors is a PMOS transistor; at least one of said MOS transistors in said pull-up network has a gate tied to a floating substrate body and; at least one of said MOS transistors in said pull-down network has a gate tied to a floating substrate body.

BRIEF DESCRIPTION OF THE DRAWINGS

In the drawings:

FIGS. 1A–1C are circuit diagrams showing conventional CMOS pull-up networks (PUN) and pull-down networks (PDN) respectively.

FIG. 2 is a cross-sectional views illustrating NMOS and PMOS transistors on an SOI substrate

Figure 3:
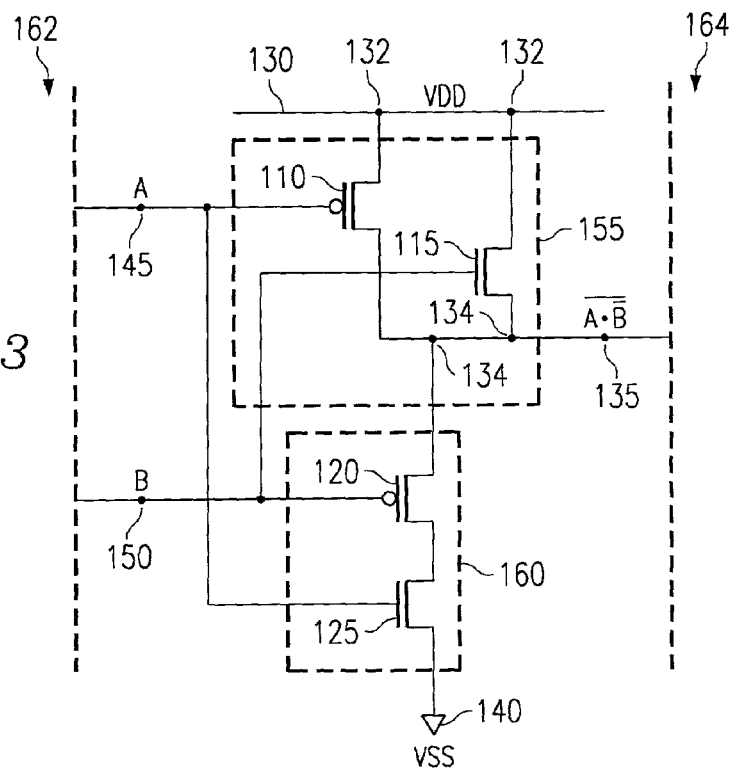
FIG. 3 is a SOI logic static circuit diagram showing an embodiment of the instant invention.

Common reference numerals are used throughout the figures to represent like or similar features. The figures are not drawn to scale and are merely provided for illustrative purposes.

DETAILED DESCRIPTION OF THE INVENTION

While the following description of the instant invention revolves around FIGS. 1–6, the instant invention can be utilized in any semiconductor device structure. The methodology of the instant invention provides a design methodology for logic circuits.

As shown in FIG. 2, the source/drain p-region 60 of a PMOS transistor can abut a source/drain n-region 65 of a NMOS transistor. In this scheme, the contact or silicide 70 that connects the p-region 60 and the n-region 65 can be optional in the "logic" sense if the p-n junction between the p-region 60 and the n-region 65 is never reversed biased. Unlike bulk CMOS technology, therefore, in SOI technology the physical connection of a PMOS transistor and an NMOS transistor along their source/drain regions consumes a silicon area that is compatible to the connection of two NMOS transistors or two PMOS transistors along their source/drain diffusions. Based on this unique property of SOI technology, a new logic for SOI termed here as "SOI logic" is defined in which both NMOS and PMOS transistors can be used in a basic transistor network. Specifically, NMOS transistors can be used in a PUN in addition to PMOS transistors and PMOS transistors can be used in a PDN in addition to NMOS transistors. In SOI logic, the gate terminals of the NMOS transistors in the PUN are not connected to a fixed voltage or the output terminal of the PUN. In addition to PUNs and PDNs, both NMOS and PMOS transistors can be used in a PTN. The buried dielectric layer 90 and the underlying substrate 100 are also illustrated in FIG. 2 along with the transistor gate dielectric 70, gate electrode 80, and sidewall structures 85.

SOI logic is a true superset of the bulk CMOS logic. In other words, any circuit topology in bulk CMOS logic also belongs to SOI logic; however, some circuit topologies in SOI logic do not belong to bulk CMOS logic. In addition to having low-power consumption and high reliability, it is important that SOI logic circuits consume minimum space on the wafer. In the design and layout of SOI logic circuits the following guidelines will aid in achieving minimum layout space. In a series connected transistor string in a basic transistor network, separately group the PMOS transistors and the NMOS transistors as much as possible to minimize the number of contacts or silicide areas that connect the p-regions of the PMOS transistors and the n-regions of the NMOS transistors. In a series connected transistor string in a PUN or a PDN, place all the PMOS transistors above the NMOS transistors, such that the contact or silicide connecting the PMOS and NMOS transistor source/drain regions is not needed, minimizing the layout area. In addition to layout area, circuit performance can be improved using low threshold voltage techniques such as electrically connecting the transistor gate to the floating body of the SOI transistor. The gate-to-body connection can be applied to the NMOS transistors and PMOS transistors in a PUN, the PMOS transistors and NMOS transistors in a PDN, and both the PMOS and NMOS transistors in a PTN. The gate-to-body connection utilizes the body effect of the MOSFET transistor to lower the threshold voltage thus improving the transistor performance.

In general, digital circuits can be divided into two groups, static and dynamic circuits. Dynamic circuits can be further subdivided into one-phase "domino" circuits, two-phase ratioed, and ratioless circuits. Ratioless dynamic circuits can be further divided into two-phase and four-phase circuits. Logic networks generally comprise combinational and sequential networks. Combinational networks comprise gates and programmable logic arrays, and sequential networks comprise latches, registers, counters, and read-write memory. Combinational logic networks operate without the need of any periodic clock signals. However all but the very smallest digital systems require sequential as well as combinational logic. As a practical matter, all systems employing sequential logic require the use of periodic clock signals for correctly synchronized operation. In static SOI logic circuits, combinational or sequential, clock signals are introduced only at normal gate inputs, identical to those used for logic inputs.

An embodiment of the instant invention for a SOI static logic circuit is illustrated in FIG. 3. This embodiment has an output logic function of $\overline{A \bullet B}$ 135 and logic inputs A 145 and B 150. The PUN 155 comprises the parallel connection of a NMOS transistor 115 and a PMOS transistor 110. This parallel connection results in a pair of common circuit nodes 132 and 134. Circuit node 132 is connected to the supply voltage $V_{DD}$ 130. Circuit node 134 is connected to the output 135 and the PDN 160. As illustrated in FIG. 3, both the NMOS transistor 115 and the PMOS transistor 110 which comprise the PUN 160 provide potential conductive paths from the supply voltage $V_{DD}$ 130 to the output node 135. The PDN 160 comprises a series connection of a PMOS transistor 120 and a NMOS transistor 125. These transistors 125, 120 provide a potential conductive path from the output node 135 to the circuit ground 140. This is to be contrasted with a bulk CMOS circuit implementing the same logic function where the PUN will generally comprise only PMOS transistors and the PDN comprise NMOS transistors. The circuit of FIG. 3 can be extended to any number of PMOS and NMOS transistors in the PUN and the PDN. In addition, the circuit shown in FIG. 3 could be a subset of a larger circuit. Thus logic inputs A 145 and B 150 could be provided by addition circuitry 162 and the logic output 135 could be connected to the other circuits 164.

Figure 4:
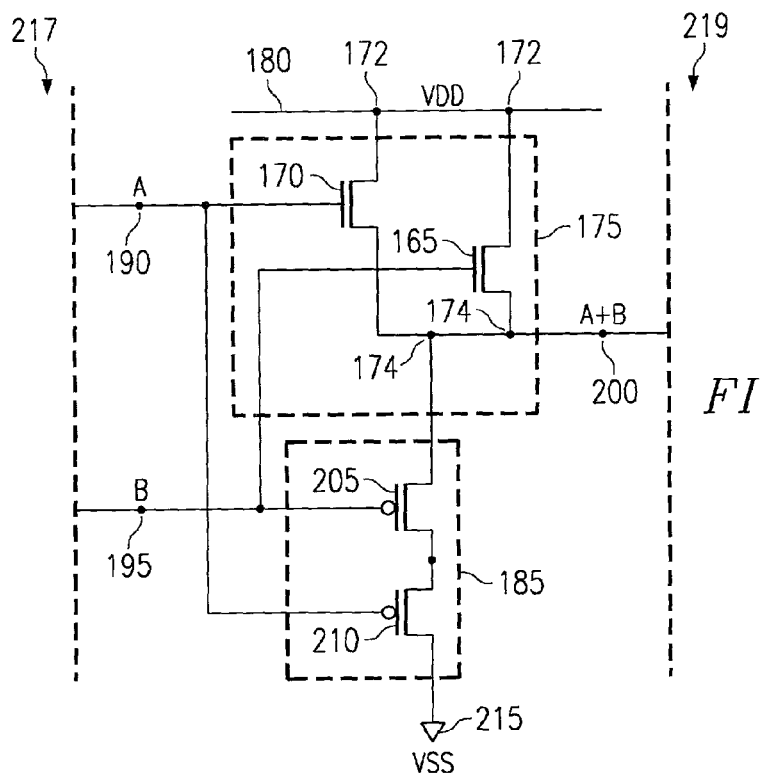
FIG. 4 is a SOI logic static circuit diagram showing a further embodiment of the instant invention.

A further embodiment of the instant invention for a SOI static logic circuit is illustrated in FIG. 4. This embodiment has an output logic function of A+B at the output node 200 from logic inputs A 190 and B 195. The PUN 175 comprises the parallel connection of NMOS transistors 165 and 170. This parallel connection results in a pair of common circuit nodes 172 and 174. Circuit node 172 is connected to the supply voltage $V_{DD}$ 180. Circuit node 174 is connected to the output node 200 and the PDN 185. As illustrated in FIG. 3, both the NMOS transistors 165 and 170 which comprise the PUN 175 provide potential conductive paths from the supply voltage $V_{DD}$ 180 to the output node 200. The PDN 185 comprises a series connection of a PMOS transistors 205 and 210. The PMOS transistors 205 and 210 which comprise the PDN 185 provide a potential conductive path from the output node 200 to the circuit ground 215. This is to be contrasted with a bulk CMOS circuit implementing the same logic function where the PUN will generally comprise only PMOS transistors and the PDN comprise NMOS transistors. The circuit of FIG. 4 can be extended to any number of PMOS and NMOS transistors in the PUN and the PDN. In addition, the circuit shown in FIG. 4 could be a subset of a larger circuit. Thus logic inputs A 190 and B 195 could be provided by addition circuitry 217 and the logic output 200 could be connected to the other circuits 219.

Figure 5:
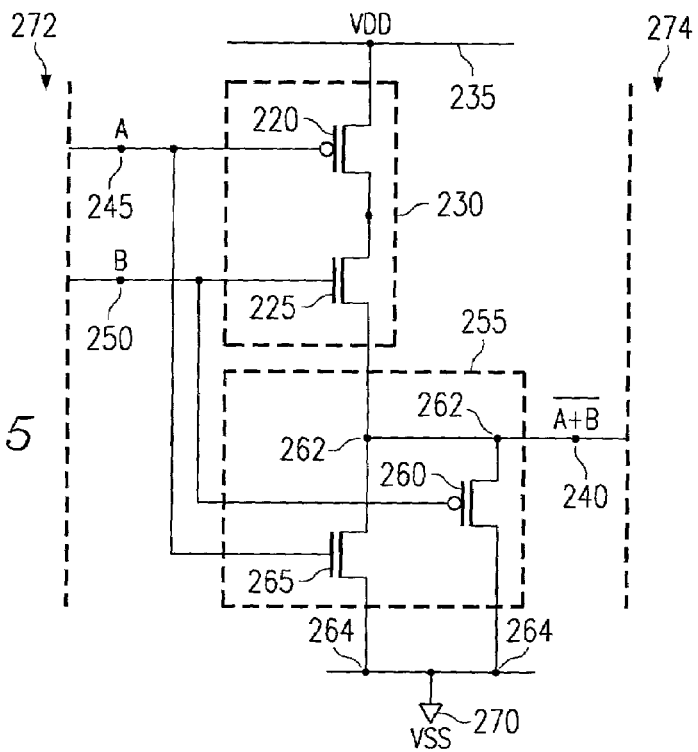
FIG. 5 is a SOI logic static circuit diagram showing a further embodiment of the instant invention.

A further embodiment of the instant invention for a SOI static logic circuit is illustrated in FIG. 5. This embodiment has an output logic function of $\overline{A+B}$ 240 from logic inputs A 245 and B 250. The PUN 230 comprises the series connection of PMOS transistor 220 and NMOS transistor 225. The PMOS transistor 220 and the NMOS transistor 225 which comprise the PUN 230 provide a potential conductive path from the output node 240 to the circuit supply voltage 235. The PDN 255 comprises a parallel connection of a NMOS transistor 265 and a PMOS transistor 260. This parallel connection results in a pair of common circuit nodes 262 and 264. Circuit node 264 is connected to the circuit ground 270. Circuit node 262 is connected to the output node 240 and the PDN 230. As illustrated in FIG. 5, both the NMOS transistor 265 and the PMOS transistor 260 which comprise the PDN 255 provide potential conductive paths from the circuit ground 270 to the output node 240. This is to be contrasted with a bulk CMOS circuit implementing the same logic function where the PUN will generally comprise only PMOS transistors and the PDN comprise NMOS transistors. The circuit of FIG. 5 can be extended to any number of PMOS and NMOS transistors in the PUN and the PDN. In addition, the circuit shown in FIG. 5 could be a subset of a larger circuit. Thus logic inputs A 245 and B 250 could be provided by addition circuitry 272 and the logic output 240 could be connected to other circuits 274.

Figure 6:
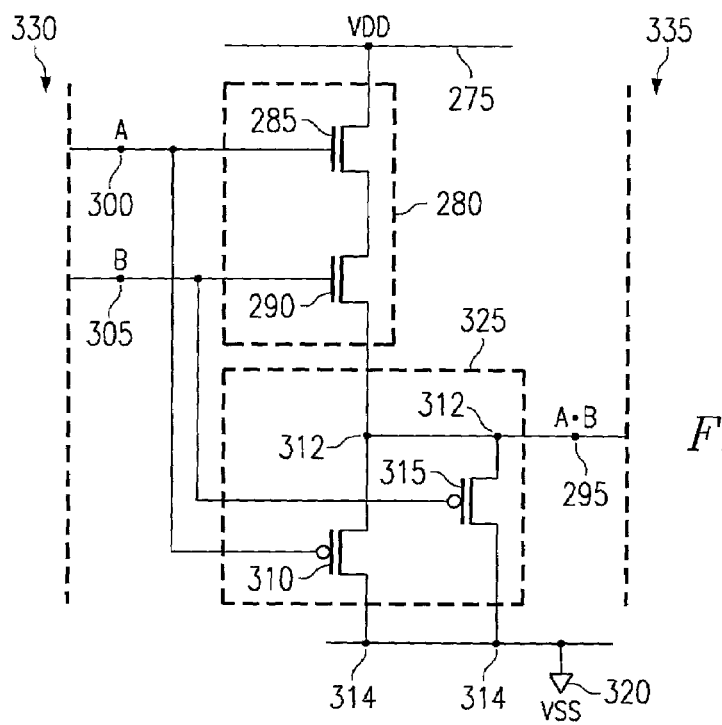
FIG. 6 is a SOI logic static circuit diagram showing a further embodiment of the instant invention.

A further embodiment of the instant invention for a SOI static logic circuit is illustrated in FIG. 6. This embodiment has an output logic function of A·B 295 and logic inputs A 300 and B 305. The PUN 280 comprises a series connection of NMOS transistors 285 and 290. These transistors 285 and 290 provide a potential conductive path form the supply voltage $V_{DD}$ 275 to the output node 295. The PDN 325 comprises a parallel connection of PMOS transistors 310 and 315. This parallel connection results in a pair of common circuit nodes 312 and 314. Circuit node 314 is connected to the circuit ground 320. Circuit node 312 is connected to the output node 295 and the PUN 280. As illustrated in FIG. 6, both the PMOS transistors 310 and 315 which comprise the PDN 255 provide potential conductive paths from the circuit ground 320 to the output node 295. This is to be contrasted with a bulk CMOS circuit implementing the same logic function where the PUN will generally comprise only PMOS transistors and the PDN comprise NMOS transistors. As illustrated in FIG. 6, both the PMOS transistors 310 and 315 which comprise the PDN 325 are connected to the circuit ground 320 and provide potential conductive paths from the circuit ground 320 to the output node 295. The NMOS transistors 285 and 290 which comprise the PUN 280 provide a potential conductive path from the output node 295 to the circuit supply voltage 275. The circuit of FIG. 6 can be extended to any number of PMOS and NMOS transistors in the PUN and the PDN. Thus logic inputs A 300 and B 305 could be provided by addition circuitry 330 and the logic output 295 could be connected to other circuits 335.

As stated above, circuit performance of the static logic circuits of the instant invention can be improved using low threshold voltage techniques such as electrically connecting the transistor gate to the floating body of the SOI transistor. The gate-to-body connection can be applied to the NMOS transistors and PMOS transistors in a PUN, the PMOS transistors and NMOS transistors in a PDN, and both the PMOS and NMOS transistors in a PTN. The gate-to-body connection utilizes the body effect of the MOSFET transistor to lower the threshold voltage thus improving the transistor performance. The static logic circuits described in the instant invention can also be applied to bulk CMOS circuits. Thus the embodiments of the invention illustrated in FIGS. 3–6 can be applied to bulk substrates that do not have a buried dielectric layer. In the bulk CMOS embodiment of the instant invention, the source/drain diffusions of the PMOS transistor will not abut the source/drain diffusions of the NMOS transistor under current bulk CMOS transistor isolation schemes. The advantages gain by using the disclosed static logic design over existing bulk CMOS static logic designs will be in the speed and performance of the logic circuits.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

I claim:

1. A static logic circuit on a SOI substrate comprising:
   a pull-up network comprising a plurality of parallel connected MOS transistors with a first and second common node, wherein at least one of said plurality of parallel connected MOS transistors is a NMOS transistor and at least one of said plurality of parallel connected MOS transistors is a PMOS transistor;
   a circuit supply voltage which is connected to said first common node of said pull-up network;
   a pull-down network which is connected to said second common node of said pull-up network wherein said pull-down network comprises a plurality of series connected MOS transistors connected to a circuit ground, and wherein at least one of said plurality of series connected MOS transistors is a NMOS transistor and at least one of said plurality of series connected MOS transistors is a PMOS transistor; and
   an output node which is connected to said second common node of said pull-up network.

2. The static logic circuit of claim 1 wherein at least one of said MOS transistors in said pull-up network has a gate tied to a floating substrate body.

3. The static logic circuit of claim 1 wherein at least one of said MOS transistors in said pull-down network has a gate tied to a floating substrate body.

4. A static logic circuit on a SOI substrate, comprising:
   a pull-down network comprising a plurality of parallel connected MOS transistors with a first and second common node, wherein at least one of said plurality of parallel connected MOS transistors is a NMOS transistor and at least one of said plurality of parallel connected MOS transistors is a PMOS transistor;
   a circuit ground which is connected to said first common node of said pull-down network;
   a pull-up network which is connected to said second common node of said pull-down network wherein said pull-down network comprises a plurality of series connected MOS transistors connected to a circuit supply voltage; and
   an output node which is connected to said second common node of said pull-down network.

5. The static logic circuit of claim 4 wherein at least one of said plurality of series connected MOS transistors is a NMOS transistor and at least one of said plurality of series connected MOS transistors is a PMOS transistor.

6. The static logic circuit of claim 4 wherein at least one of said MOS transistors in said pull-down network has a gate tied to a floating substrate body.

7. The static logic circuit of claim 4 wherein at least one of said MOS transistors in said pull-up network has a gate tied to a floating substrate body.

8. A static logic circuit on a SOI substrate, comprising:
   a pull-down network comprising a plurality of parallel connected PMOS transistors with a first and second common node;
   a circuit ground which is connected to said first common node of said pull-down network;
   a pull-up network which is connected to said second common node of said pull-down network; and an output node which is connected to said second common node of said pull-down network.

9. The static logic circuit of claim 8 wherein said pull-up network comprises a plurality of series connected NMOS transistors connected to a circuit supply voltage.

10. The static logic circuit of claim 8 wherein at least one of said MOS transistors in said pull-down network has a gate tied to a floating substrate body.

11. The static logic circuit of claim 9 wherein at least one of said MOS transistors in said pull-up network has a gate tied to a floating substrate body.

12. A static logic circuit on a SOI substrate, comprising:
 a pull-up network comprising a plurality of parallel connected NMOS transistors with a first and second common node;
 a circuit supply voltage which is connected to said first common node of said pull-up network;
 a pull-down network which is connected to said second common node of said pull-up network; and
 an output node which is connected to said second common node of said pull-up network.

13. The static logic circuit of claim 12 wherein said pull-down network comprises a plurality of series connected PMOS transistors connected to a circuit ground.

14. The static logic circuit of claim 12 wherein at least one of said MOS transistors in said pull-up network has a gate tied to a floating substrate body.

15. The static logic circuit of claim 13 wherein at least one of said MOS transistors in said pull-down network has a gate tied to a floating substrate body.

* * * * *